(12) United States Patent
Chen et al.

(10) Patent No.: US 9,900,976 B1
(45) Date of Patent: Feb. 20, 2018

(54) INTEGRATED CIRCUIT PACKAGE INCLUDING FLOATING PACKAGE STIFFENER

(71) Applicant: Intel Corporation, Santa Clara, CA (US)

(72) Inventors: Chung-Hao Chen, Portland, OR (US); Min Keen Tang, Taman Sri Nibong (MY); Li-Sheng Weng, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/376,469

(22) Filed: Dec. 12, 2016

(51) Int. Cl.
*H05K 9/00* (2006.01)
*H05K 1/02* (2006.01)
*G06F 1/16* (2006.01)

(52) U.S. Cl.
CPC ......... *H05K 1/0216* (2013.01); *G06F 1/1698* (2013.01); *H05K 9/0081* (2013.01)

(58) Field of Classification Search
CPC ... H05K 1/0216; H05K 9/0081; G06F 1/1698
USPC ................ 174/350; 361/816, 818
See application file for complete search history.

(56) References Cited

U.S. PATENT DOCUMENTS

| | | | |
|---|---|---|---|
| 5,783,464 A | 7/1998 | Burns | |
| 5,940,271 A * | 8/1999 | Mertol | H01L 23/4093 165/185 |
| 6,114,761 A * | 9/2000 | Mertol | H01L 23/367 257/706 |
| 6,462,960 B1 * | 10/2002 | Watanabe | H05K 9/0015 174/363 |
| 2003/0151148 A1 * | 8/2003 | Camenforte | H01L 23/36 257/780 |
| 2006/0091562 A1 * | 5/2006 | Lee | H01L 23/3675 257/778 |

(Continued)

FOREIGN PATENT DOCUMENTS

| | | |
|---|---|---|
| JP | 2005277389 A | 10/2005 |
| JP | 2013093623 A | 5/2013 |

(Continued)

OTHER PUBLICATIONS

Final Office Action dated May 19, 2017 for U.S. Appl. No. 14/642,316, 11 pages.

(Continued)

*Primary Examiner* — Sherman Ng
(74) *Attorney, Agent, or Firm* — Schwabe, Williamson & Wyatt, P.C.

(57) ABSTRACT

Apparatus and method to provide integrated circuit (IC) package integrity without adverse performance degradation are disclosed herein. In some embodiments, an apparatus may include one or more integrated circuits (ICs); a metallic structure that encircles the one or more ICs without being in contact with the one or more ICs, wherein the metallic structure is without an electrical ground; and a conductive epoxy layer disposed below and in contact with the metallic structure, wherein the conductive epoxy is to reduce an electromagnetic field induced by the metallic structure in response to a presence of a wireless signal that operates at approximately a resonant frequency associated with the metallic structure.

18 Claims, 9 Drawing Sheets

(56) References Cited

U.S. PATENT DOCUMENTS

| | | | |
|---|---|---|---|
| 2009/0315156 A1 | 12/2009 | Harper | |
| 2010/0142155 A1* | 6/2010 | Mertol | H01L 23/055 361/719 |
| 2011/0285606 A1* | 11/2011 | De Graauw | H01L 23/49816 343/904 |
| 2016/0268213 A1* | 9/2016 | Jiang | H01L 23/552 |

FOREIGN PATENT DOCUMENTS

| | | |
|---|---|---|
| JP | 2014212150 A1 | 11/2014 |
| KR | 20140113467 A | 9/2014 |
| TW | 201208011 A | 2/2012 |
| TW | 201219535 A | 5/2012 |

OTHER PUBLICATIONS

Chung, D.D.L. et al., "Conducting Polymer-Matrix Composites," Materials for Electronic Packaging, Butterworth-Heinemann, (1995), pp. 153-171.

Colaneri, N. F. et al, "EMI shielding measurements of conductive polymer blends", IEEE Transactions on Instrumentation and Measurement, vol. 41, No. 2, (Apr. 1992), pp. 291-297.

Isern-Flecha, I., "Surface studies of electroless nickel/copper plated polycarbonate subjected to Batelle class II flowing mixed gas environment", J. Vac. Sci. Technol. A, 7(3), (1989), pp. 1702-1705.

Jackson, B.C. et al., "A practical guide on the use of electroless coatings for EMI shielding", 9th International Conference on Electromagnetic Compatibility, Conference Publication No. 396, (1994), pp. 119-124.

Jillek, W. et al., "Embedded components in printed circuit boards: a processing technology review", International Journal of Advanced Manufacturing Technology, vol. 25, Springer-Verlag London Limited, (Jul. 21, 2004), pp. 350-360.

Non-Final Office Action dated Mar. 16, 2016 for U.S. Appl. No. 14/642,316, 10 pages.

Final Office Action dated Oct. 7, 2016 for U.S. Appl. No. 14/642,316, 8 pages.

Non-Final Office Action dated Jan. 25, 2017 for U.S. Appl. No. 14/642,316, 9 pages.

* cited by examiner

INTEGRATED CIRCUIT PACKAGE INCLUDING FLOATING PACKAGE STIFFENER

FIELD OF THE INVENTION

The present disclosure relates generally to the technical field of computing, and more particularly, to packaging of integrated circuits.

BACKGROUND

The background description provided herein is for the purpose of generally presenting the context of the disclosure. Unless otherwise indicated herein, the materials described in this section are not prior art to the claims in this application and are not admitted to be prior art or suggestions of the prior art, by inclusion in this section.

One or more integrated circuits (ICs) may be arranged together to form a package (also referred to as an IC package). The package may also include one or more components in order to facilitate assembly of the package, structural integrity of the package during operation, and/or the like. Unfortunately, while providing such benefits, these component(s) may also cause undesirable effects. When the ICs include wireless communication capabilities, such as WiFi, for instance, wireless signals may be adversely affected due to the radio frequency interference (RFI) caused by the component(s) included in the package. The amount of RFI may not be insubstantial and the resulting degradation to the wireless signals may be unacceptable.

BRIEF DESCRIPTION OF THE DRAWINGS

Embodiments will be readily understood by the following detailed description in conjunction with the accompanying drawings. The concepts described herein are illustrated by way of example and not by way of limitation in the accompanying figures. For simplicity and clarity of illustration, elements illustrated in the figures are not necessarily drawn to scale. Where considered appropriate, like reference labels designate corresponding or analogous elements.

DETAILED DESCRIPTION

Figure 1:
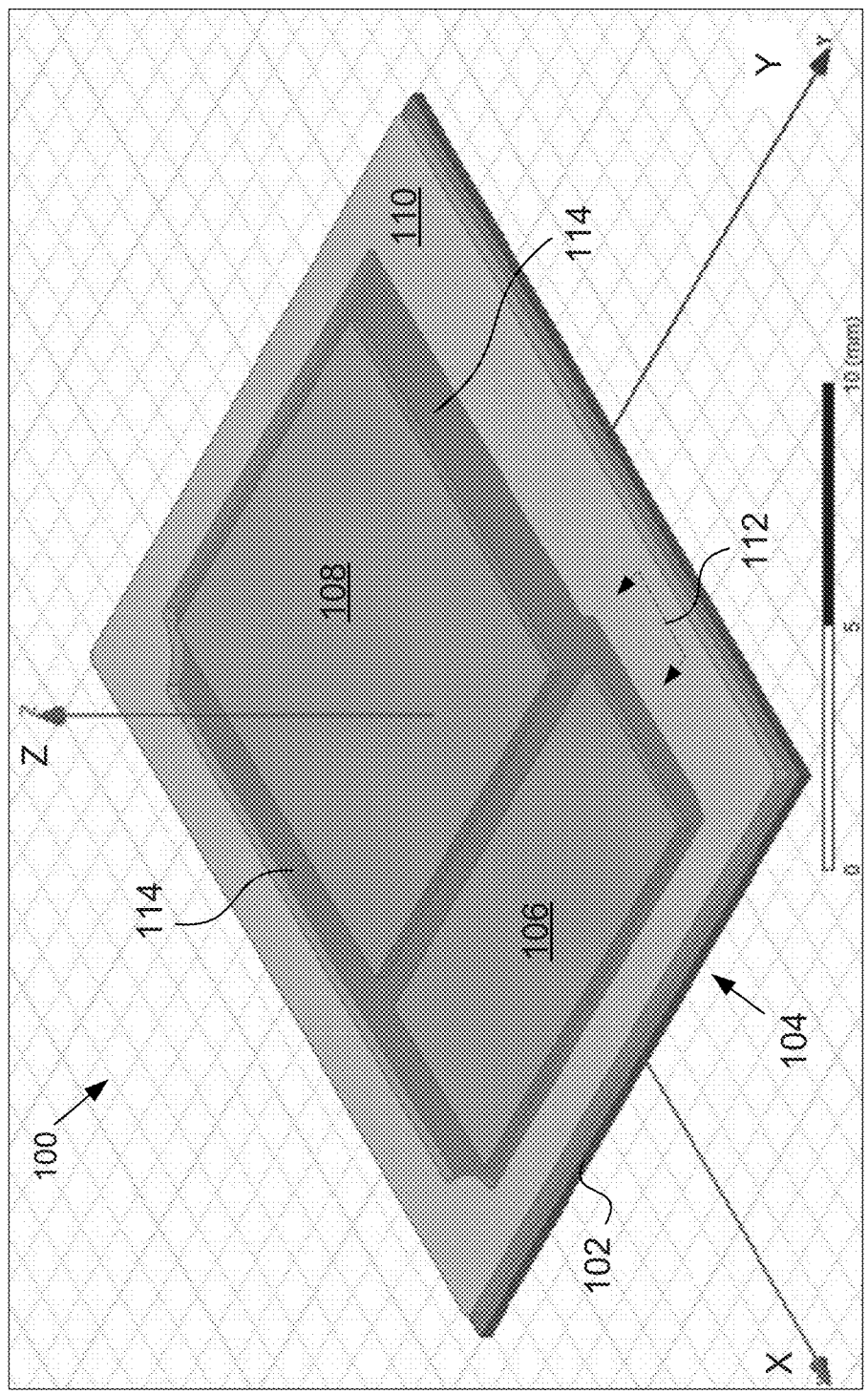
FIG. 1 depicts a perspective view of an assembly incorporating aspects of the present disclosure, according to some embodiments.

Embodiments of apparatuses and methods related to integrated circuit (IC) assemblies are described. In some embodiments, IC assemblies may include one or more integrated circuits (ICs); a metallic structure that encircles the one or more ICs without being in contact with the one or more ICs, wherein the metallic structure may be without an electrical ground; and a conductive epoxy layer disposed below and in contact with the metallic structure. The conductive epoxy may reduce an electromagnetic field induced by the metallic structure in response to a presence of a wireless signal that operates at approximately a resonant frequency associated with the metallic structure. These and other aspects of the present disclosure will be more fully described below.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. Additionally, it should be appreciated that items included in a list in the form of "at least one A, B, and C" can mean (A); (B); (C); (A and B); (B and C); (A and C); or (A, B, and C). Similarly, items listed in the form of "at least one of A, B, or C" can mean (A); (B); (C); (A and B); (B and C); (A and C); or (A, B, and C).

The disclosed embodiments may be implemented, in some cases, in hardware, firmware, software, or any combination thereof. The disclosed embodiments may also be implemented as instructions carried by or stored on one or more transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, it may not be included or may be combined with other features.

FIG. 1 depicts a perspective view of an assembly 100 incorporating aspects of the present disclosure, according to some embodiments. Assembly 100 may also be referred to as a package, a thin package, a component, an integrated circuit (IC) assembly, an IC package, an IC component, or the like. Assembly 100 may include a package substrate 102, an adhesive 104, one or more IC dies (e.g., IC die 106, IC die 108), and a package stiffener 110. In some embodiments, adhesive 104, IC dies 106 and 108, and package stiffener 110 may be disposed above the package substrate 102. IC die 106 and IC die 108 may also be electrically coupled to the package substrate 102. Package stiffener 110 may encircle, border, or bracket the IC dies 106 and 108 and may be substantially co-planar with the IC dies 106 and 108 (along an x-y plane with respect to Cartesian coordinate axes as shown in FIG. 1). The adhesive 104 may be disposed between the package stiffener 110 and the package substrate 102 (along a z-axis). Adhesive 104 may be configured to attach or secure the stiffener 110 to the package substrate 102 as well as provide decreased noise coupling at the frequency bands of interest, to be discussed in greater detail below.

Figure 2:
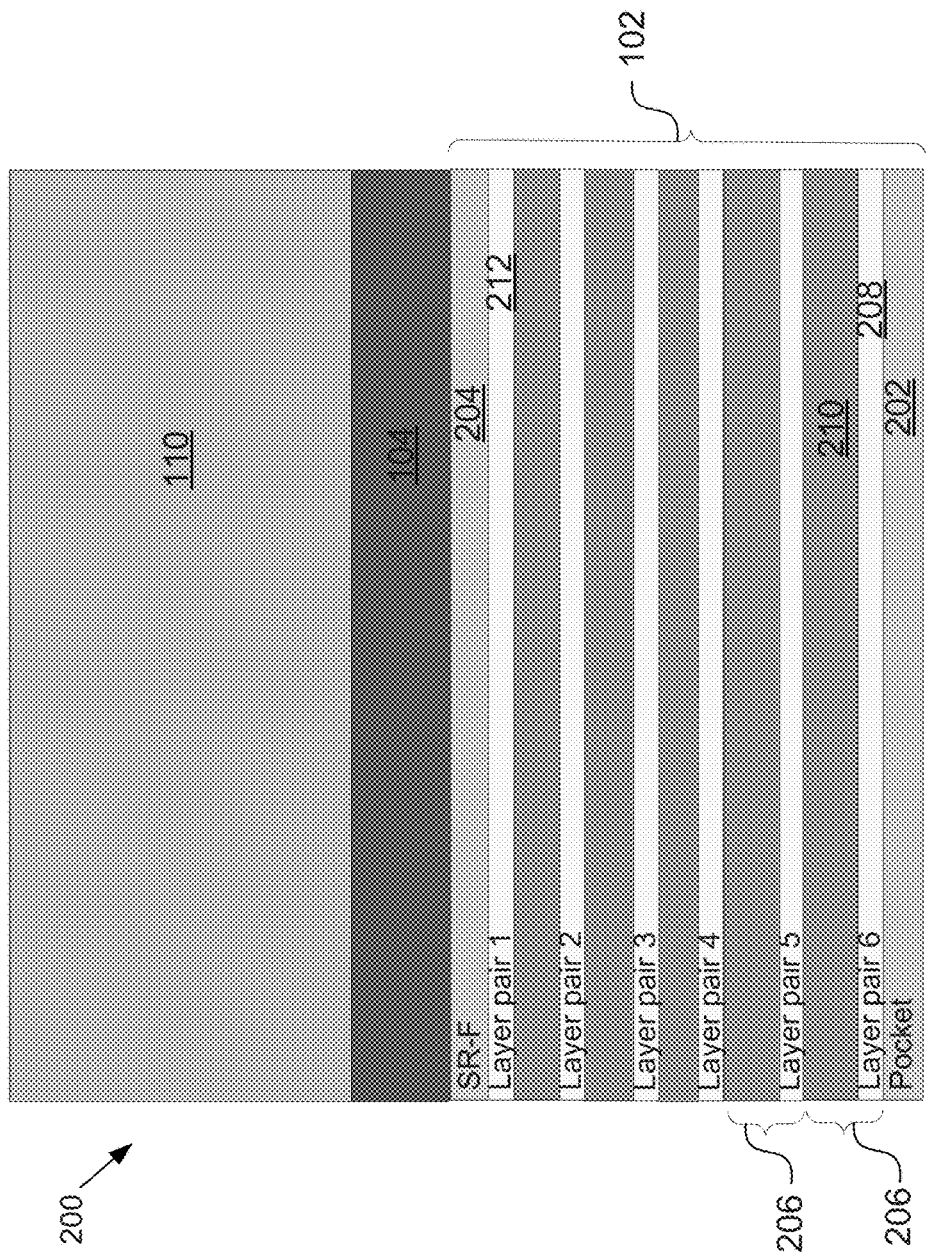
FIG. 2 depicts an example cross sectional view of at least a portion of the assembly of FIG. 1, according to some embodiments.

In some embodiments, the package substrate 102 (also referred to as a substrate) may comprise a multi-layer structure. FIG. 2 depicts an example cross sectional view of at least a portion 200 of the assembly 100 along a line 112 of FIG. 1, according to some embodiments. As shown in FIG. 2, the portion 200 may include the package substrate 102, in which the package substrate 102 may include a first layer 202 disposed the furthest from the package stiffener 110, a second layer 204 disposed the closest to the package stiffener 110, and a plurality of layer pairs 206 disposed between the first and second layers 202, 204. In some embodiments, the first layer 202 may comprise a non-conductive layer and may also be referred to as a pocket or bottom layer of the package substrate 102. The second layer 204 may comprise a solder resist layer or a non-conductive layer. Each layer pair of the plurality of layer pairs 206 may comprise a conductive or metallic layer 208 disposed below a dielectric layer 210. Hence, alternating layers of conductive and dielectric material may comprise the plurality of layer pairs 206. Each layer pair of the plurality of layer pairs 206 may be the same or different from each other in thickness, material, and/or IC structures included therein. For example, a particular layer pair of the plurality of layer pairs 206 may include a ground plane for the assembly 100 (e.g., a ground plane layer 212) while another particular layer pair of the plurality of layer pairs 206 may include vias or electrical coupling structures.

In some embodiments, the package substrate 102 may include one or more printed circuit boards (PCBs), IC structures or components, IC related connectors or connection structures, and/or bonding material such as pre-impregnated composite fibers (pre-preg) with epoxy resin that may bond adjacent materials together. In alternative embodiments, the package substrate 102 may comprise a coreless structure or an ultra-thin core (UTC) structure. UTC structures, for instance, may comprise a 100 to 200 micron (μm) thick core sandwiched between a plurality of layers.

The one or more IC dies included in the assembly 100, such as IC dies 106 and/or 108, may each comprise an IC, circuitry, IC chip, and/or other structure to be coupled to each other, assembled or packaged together, and/or augmented with shielding, waterproofing, shock absorption, improved connectivity structures, adaptors, or the like within the assembly 100. IC die 106 and/or 108 may comprise, without limitation, central processing units (CPUs), processors, graphical processing units (GPUs), transceivers, controllers, memory, storage, and the like.

The package stiffener 110 may also be referred to as a stiffener, a floating stiffener, a package rigidity structure, a package ring, a package collar, and the like. In some embodiments, the package stiffener 110 may be included in the assembly 100 for structural purposes: to improve rigidity or structural strength of the assembly 100 and/or otherwise facilitate integrity of the IC dies 106 and 108 during formation of the assembly 100. In some embodiments, package stiffener 110 may comprise a metallic material, such as stainless steel. In some embodiments, package stiffener 110 may form a continuous or unitary structure adjacent to the IC dies 106 and 108. The package stiffener 110 may fully encircle the IC dies 106 and 108 in the x-y plane without contacting the IC dies 106 and 108 (e.g., a gap 114 may exist between the IC dies 106, 108 and the package stiffener 110).

In some embodiments, package stiffener 110 may be located at or near the perimeter or edge of a top side of the package substrate 102. For example, the outer edges of the package stiffener 110 may align (or nearly align) with the outer edges of the assembly 100. The package stiffener 110 may comprise any of a variety of shapes, including not limited to, a solid poly-toroid, a rectangular box with a middle cutout, a ring, a donut shape, a picture frame shape, and the like. A particular side of the package stiffener 110 that extends inward toward the IC dies 106, 108 may be the same or different dimension from another side of the package stiffener 110. The inner perimeter or cutout shape of the package stiffener 110 may also be any of a variety of shapes. In FIG. 1, for instance, two of the four inner corners of the package stiffener 110 may comprise rounded corners of a rectangle.

Alternatively, package stiffener 110 may comprise a discontinuous structure or a multi-piece structure adjacent to the IC dies 106 and 108. Package stiffener 110 may only partially encircle the IC dies 106 and/or 108. Package stiffener 110 may comprise more than one material, in which a first portion may comprise a first material and a second portion may comprise a second material that is different from the first material.

In some embodiments, the package stiffener 110 may be attached, secured, or connected to the package substrate 102 using adhesive 104. Adhesive 104 may comprise a non-conductive epoxy material mixed with a conductive material. In some embodiments, adhesive 104 may comprise epoxy interspersed with metallic flakes or particles, such as silver flakes. In some embodiments, the adhesive 104 may have a conductivity in the range of approximately 10 to $10^5$ Siemens/meter (S/m), a conductivity of approximately 50,000 S/m, and/or a conductivity suitable to achieve the noise characteristics as discussed in detail below. While such attachment/securement/connection may provide an electrical coupling between the package stiffener 110 and package substrate 102, the package stiffener 110 may not be electrically grounded to the package substrate 102 (e.g., no electrical grounding pathway between the package stiffener 110 and package substrate 102). Hence, the package stiffener 110 may comprise a floating or electrically floating stiffener. Adhesive 104 may also be referred to as a high resistive epoxy, high resistive epoxy layer, a lossy epoxy, a lossy epoxy layer, a conductive adhesive, or a conductive adhesive layer.

In some embodiments, the package stiffener 110 may comprise a metal structure having a rectangular picture frame-like shape, the outer or overall dimensions of the assembly 100 and/or the package stiffener 110 may be, but not limited to, approximately 20 by 16.5 mm (in the x-y plane), the thickness of the package stiffener 110 (along the z-axis) may be approximately 250 µm, the thickness of the adhesive 104 (along the z-axis) of approximately 40 to 50 µm, the thickness of the assembly 100 (along the z-axis) may be less than 1 mm, and the conductivity of the adhesive 104 may be approximately 10 to $10^5$ S/m.

Figure 3:
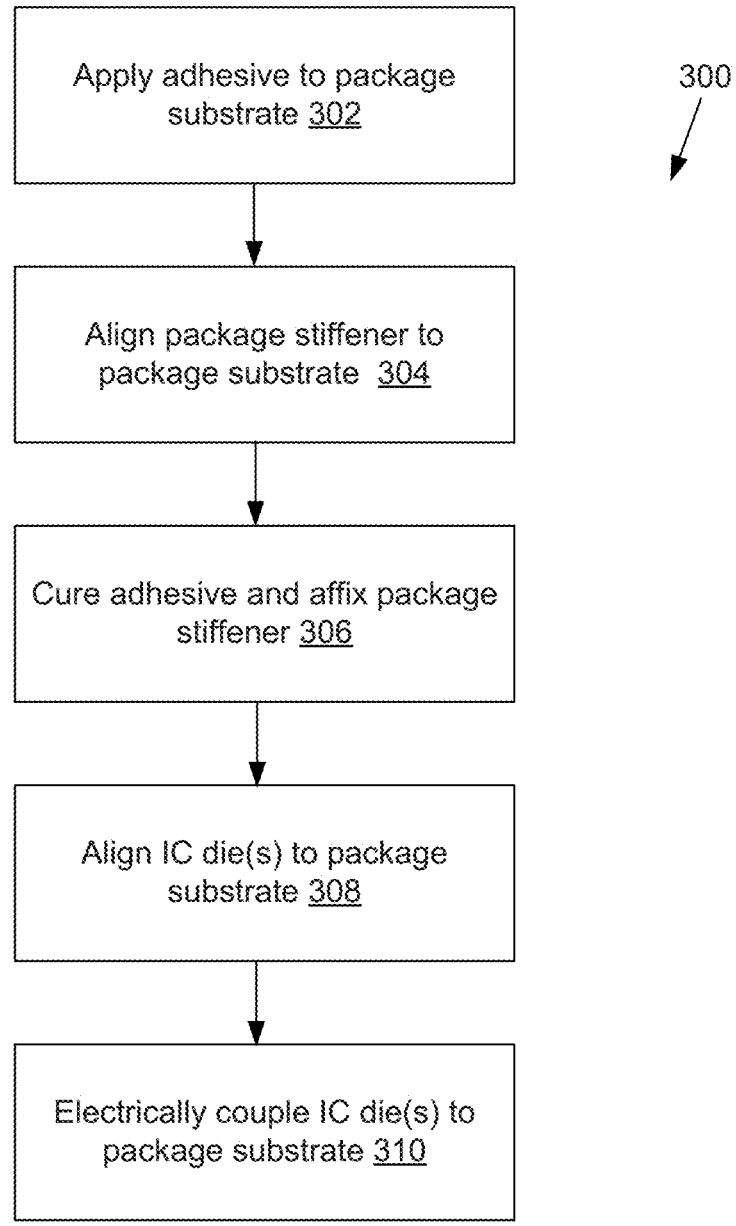
FIG. 3 depicts an example process for forming the assembly of FIG. 1, according to some embodiments.

FIG. 3 depicts an example process 300 for forming the assembly 100, according to some embodiments. At a block 302, adhesive 104 may be applied or provided to at least a portion of a side of the second layer 204 of the package substrate 102 (e.g., the side of the second layer 204 furthest from the first layer 202). The adhesive 104 may be applied to the portion(s) of the top side of the second layer 204 that may align/coincide with where the package stiffener 110 may be positioned, such as the outer perimeter portion(s) of the top side of the second layer 204. In some embodiments, the adhesive 104 may be in a liquid, gel, or other aqueous solution that may be poured or sprayed onto the second layer 204. In other embodiments, the adhesive 104 may be provided as a film or layer that may be placed onto the second layer 204.

Next at a block 304, package stiffener 110 may be aligned or positioned relative to the package substrate 102 using, for example, alignment markers. Package stiffener 110 may be positioned above the adhesive 104. With the package stiffener 110 in place relative to the package substrate 102, at least the adhesive 104 may be cured or otherwise processed to attach the package stiffener 110 to the package substrate 102 and to provide an electrical connection between the package stiffener 110 and package substrate 102, at a block 306. In some embodiments, curing and/or other processes applied to the adhesive 104 may "activate" the bonding properties of the epoxy and/or intended conductivity of the metallic flakes or particles within the adhesive 104, such as ensuring relative even dispersal within the layer to provide the desired conductivity characteristics.

At a block 308, the one or more IC dies (e.g., IC dies 106, 108) to be included in the assembly 100 may be aligned or positioned relative to the package substrate 102. And at a block 310, the one or more IC dies may be electrically coupled or connected to the package substrate 102, including establishing an electrical ground pathway to the package substrate 102, such as by connecting to a ground plane or layer included in the package substrate 102.

Figure 4:
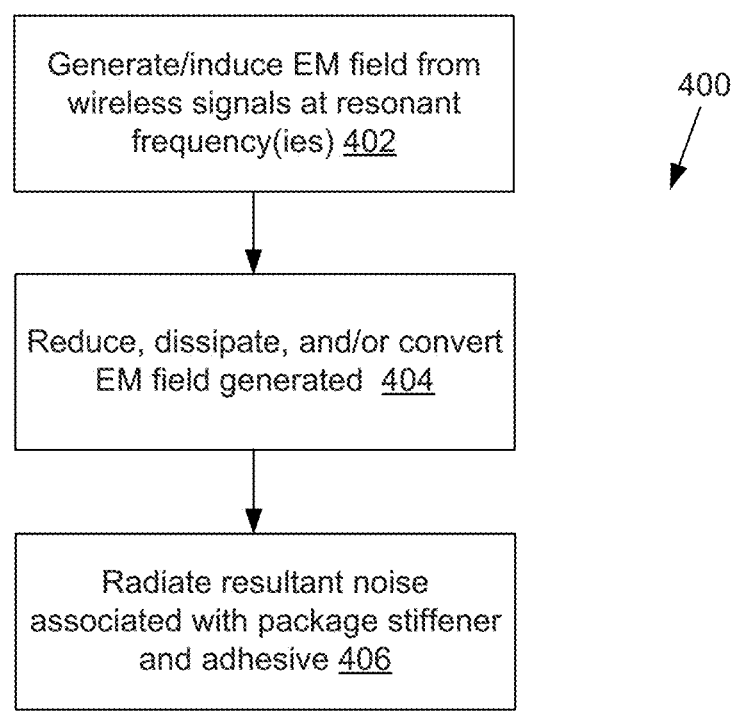
FIG. 4 depicts an example process associated with radiative performance of at least a portion of the assembly of FIG. 1, according to some embodiments.

FIG. 4 depicts an example process 400 associated with a characteristic of at least a portion of the assembly 100, according to some embodiments. At a block 402, in the presence of wireless signals (also referred to as signals, radio signals, excitation signals, or signal excitation) operating at particular frequencies, the package stiffener 110 may act like an antenna that couples to the wireless signals and generates (additional) noise signals or other undesirable electromagnetic (EM) radiation. In some embodiments, the signal excitation may be present underneath or adjacent or above the package stiffener 110, couple to the package stiffener 110, and radiate at a radio operating frequency such as, but not limited to, a band of 2.5 GHz and/or a harmonic of 2.5 GHz. The signals may be generated by one or more of the IC dies 106, 108, one or more structures included in the package substrate 102, and/or one or more structures in proximity to the assembly 100. For instance, the signals may originate from one or more radiative antennas, wireless signal antennas, WiFi antennas, and/or the like included in and/or adjacent to the assembly 100.

Figure 5:
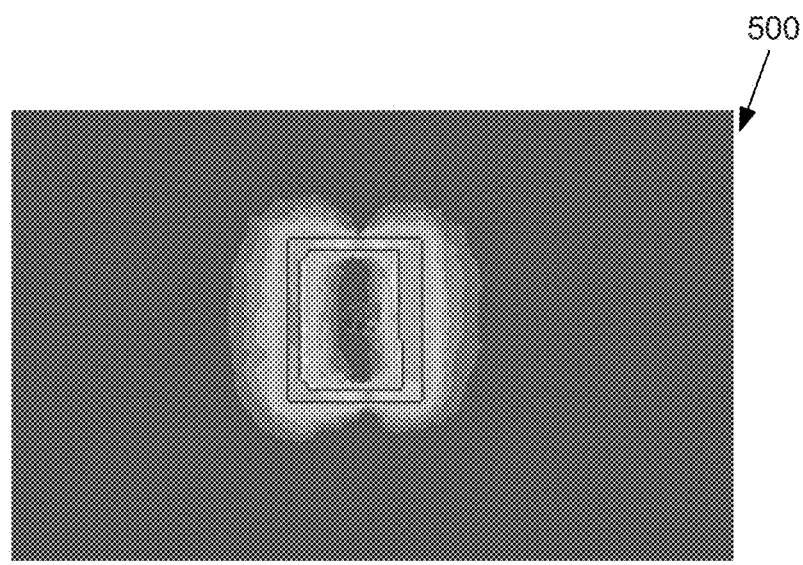
FIG. 5 depicts an example plot showing the EM field distribution pattern associated with a package stiffener, according to some embodiments.

In some embodiments, at (or near) resonant frequency(ies) of the package stiffener 110, the EM field or radiation generated by the package stiffener 110 (associated with the signals discussed above) may distribute between the package stiffener 110 and a package ground of the assembly 100 (e.g., the ground plane layer 212). FIG. 5 depicts an example plot 500 showing the EM field distribution pattern at 2.39 GHz associated with package stiffener 110, according to some embodiments.

The EM field or radiation generated by the package stiffener 110 may be reduced, dissipated, attenuated, dampened, and/or converted by the adhesive 104, at a block 404. In some embodiments, the high lossy characteristic associated with the adhesive 104 may change at least a portion of the magnitude of the EM field or radiation to heat, thereby decreasing the strength of the EM field or radiation. The adhesive 104 may weaken or decrease the noise coupling associated with the package stiffener 110 across certain frequency bands, such as at or near 2.4 GHz and/or harmonics of 2.4 GHz. As a result, a lower noise radiation level associated with the package stiffener 110 may be achieved (block 406). Because an electrical ground may be absent for the package stiffener 110, the resonant frequency of the package stiffener 110 may not be affected or changed. In some embodiments, the adhesive 104 may decrease the noise generated by the package stiffener 110 by more than 5 dB or at least 10 dB at the package stiffener 110's resonant frequency. The amount of noise dissipation may vary at different frequencies.

Figure 6:
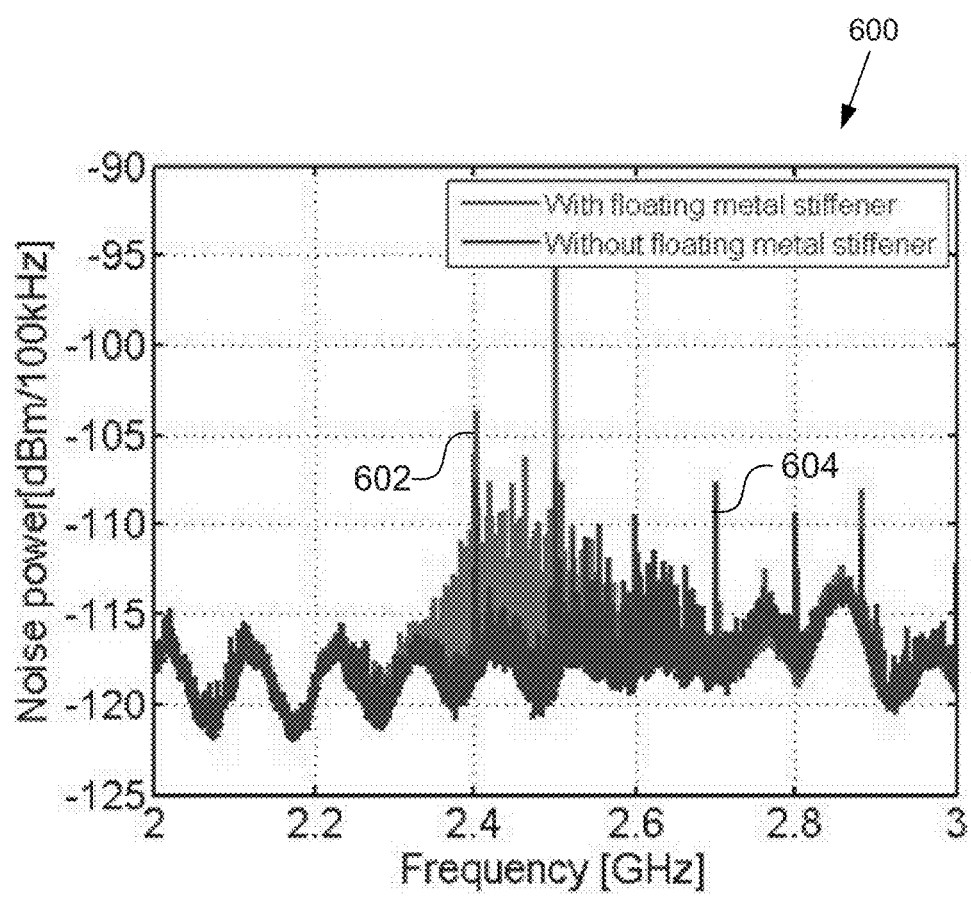
FIG. 6 depicts an example plot showing measured noise coupled to a WiFi antenna from a package stiffener, according to some embodiments.

In some embodiments, one or more of the IC dies 106, 108 and/or another structure located in proximity to the package stiffener 110 may include an integrated radio/transceiver and/or associated sub-components, such as a WiFi radio/transceiver and/or antenna operating in the 2.4 GHz band. In some embodiments, the resonant frequency of the package stiffener 110 may also be at or near 2.4 GHz. Under these conditions, the noise associated with the package stiffener 110, caused by the EM field or radiation discussed above, may contribute radio frequency interference (RFI) to the operation of the WiFi radio/transceiver/antenna. For example, FIG. 6 depicts an example plot 600 showing measured noise coupled to a WiFi antenna which may be located approximately 5 cm from a package stiffener. The measured noise in the presence of a floating metal stiffener, such as the package stiffener 110, but without the adhesive 104 is shown in a line 602. The measured noise when no floating metal stiffener is present is shown in a line 604. With the inclusion of the floating metal stiffener, the noise may increase approximately 10 decibel (dB) for WiFi operating in the 2.5 GHz band in comparison to the noise level without a floating metal stiffener, which may result in an approximate 40% decrease in the throughput data rate.

Figure 7:
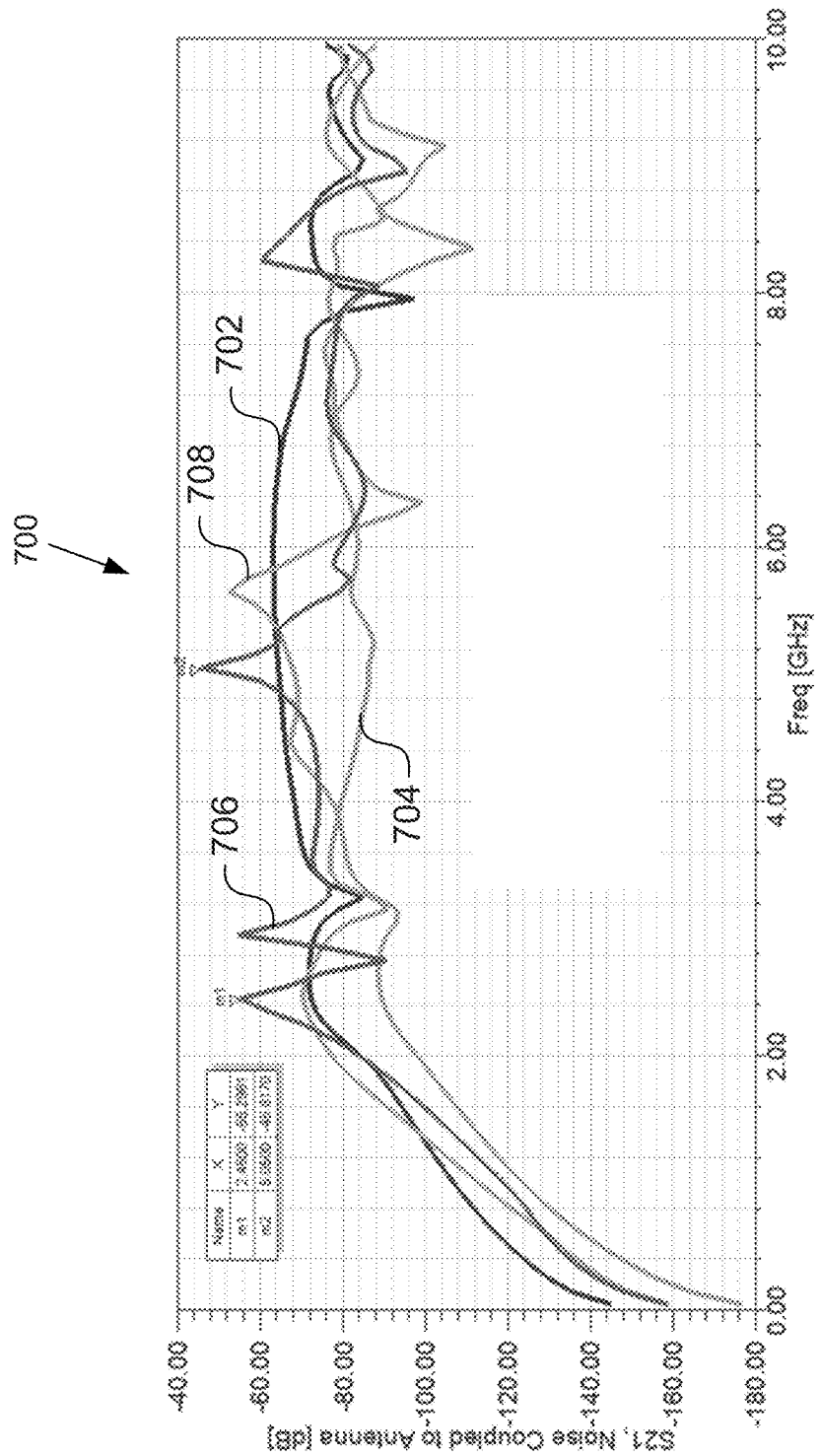
FIG. 7 depicts an example plot showing noise coupled to a WiFi antenna from various package configurations, according to some embodiments.

Comparisons of noise coupled to a WiFi antenna, which may be located approximately 5 cm, from various package configurations are shown in an example plot 700 of FIG. 7, according to some embodiments. A plot line 702 may be associated with a package with no package stiffener (and no epoxy layer above the package substrate). A plot line 704 may be associated with a package including the package stiffener 110 and adhesive 104 (e.g., the package may comprise the assembly 100). A plot line 706 may be associated with a package that includes a package stiffener (similar to package stiffener 110) and a non-conductive epoxy between the package stiffener and package substrate. A plot line 708 may be associated with a package that includes a package stiffener (similar to package stiffener 110), the package stiffener being electrically grounded to the package substrate at four grounding points, and a conductive epoxy having a conductivity greater than approximately $10^6$ S/m between the package stiffener and package substrate. As shown in FIG. 7, the noise associated with the assembly 100 (see plot line 704) may be approximately the same or less than noise with no package stiffener (see plot line 702) across a frequency range of 0 to 10 GHz, and in particular, at the 2.4 GHz and 5.06 GHz frequency bands.

Figure 8:
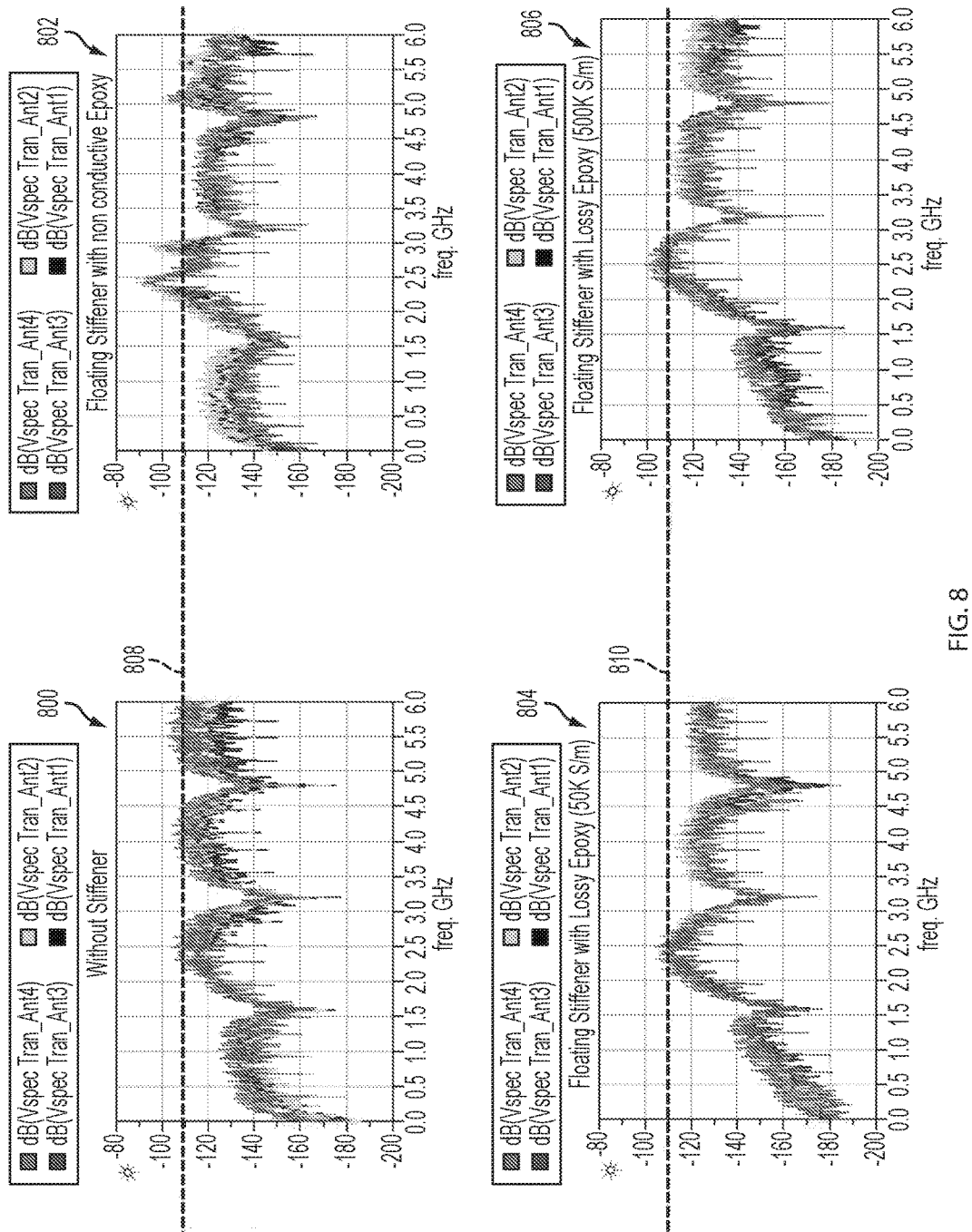
FIG. 8 depicts additional noise coupling plots for various configurations of packages, according to some embodiments.

FIG. 8 depicts additional noise coupling plots for various configurations of packages, according to some embodiments. A plot 800 may be associated with a package without a package stiffener; a plot 802 may be associated with a package including a package stiffener (similar to package stiffener 110) and a non-conductive epoxy disposed between the package stiffener and package substrate; a plot 804 may be associated with a package including a package stiffener (similar to package stiffener 110) and an epoxy disposed between the package stiffener and package substrate having a conductivity of approximately 50,000 S/m (similar to adhesive 104) (e.g., package may comprise the assembly 100); and a plot 806 may be associated with a package including a package stiffener (similar to package stiffener 110) and an epoxy disposed between the package stiffener and package substrate having a conductivity of approximately 500,000 S/m. Each of the package stiffener associated with plots 802, 804, 806 may comprise a floating package stiffener in that no electrical ground may exist to the package substrate.

A line 808 may represent a noise threshold level for plots 800 and 802, with noise distribution below line 808 comprising acceptable levels of noise coupling. Notice that at 2.4 GHz, plot 800 is below line 808 while plot 802 is above line 808, indicative of a package including a floating package stiffener and non-conductive epoxy having unacceptably high noise coupling characteristic in the frequency range of interest. Similarly, a line 810 may represent a noise threshold level for plots 804 and 806, with noise distribution below line 810 comprising acceptable levels of noise coupling. Among the packages including a package stiffener (among plots 802, 804, and 806), a package configured such as the assembly 100 (corresponding to plot 804) may have the best noise coupling profile at least in the 2.4 GHz frequency band, which is the same frequency band in which WiFi may operate. Plots 804 and 800 may be similar to each other in at least the 2.4 GHz frequency band.

In this manner, a floating package stiffener may be included in a package assembly to provide structural benefits, during manufacture and/or operation of the package assembly, without causing unacceptable levels of RFI to nearby wireless communication components, such as WiFi communication components operating in the 2.4 GHz frequency band. Additionally, the inclusion of a package stiffener may not require additional design and/or manufacturing constraints to at least a package substrate included in the package assembly, because the package stiffener may not be required to be electrically grounded to the package substrate. Other components in the package assembly, such as an epoxy layer between the package stiffener and package substrate, may comprise a lower cost component because a conductivity characteristic associated with the epoxy layer of approximately 10 to $10^5$ S/m may be adequate to provide the noise attenuation discussed above.

In some embodiments, assembly 100 may comprise a component included in a device or system such as, but not limited to, computers, laptops, smartphones, tablets, Internet of Things type devices, wearable devices, servers, workstations, mobile devices, and a variety of other computer devices, apparatuses, or systems.

Figure 9:
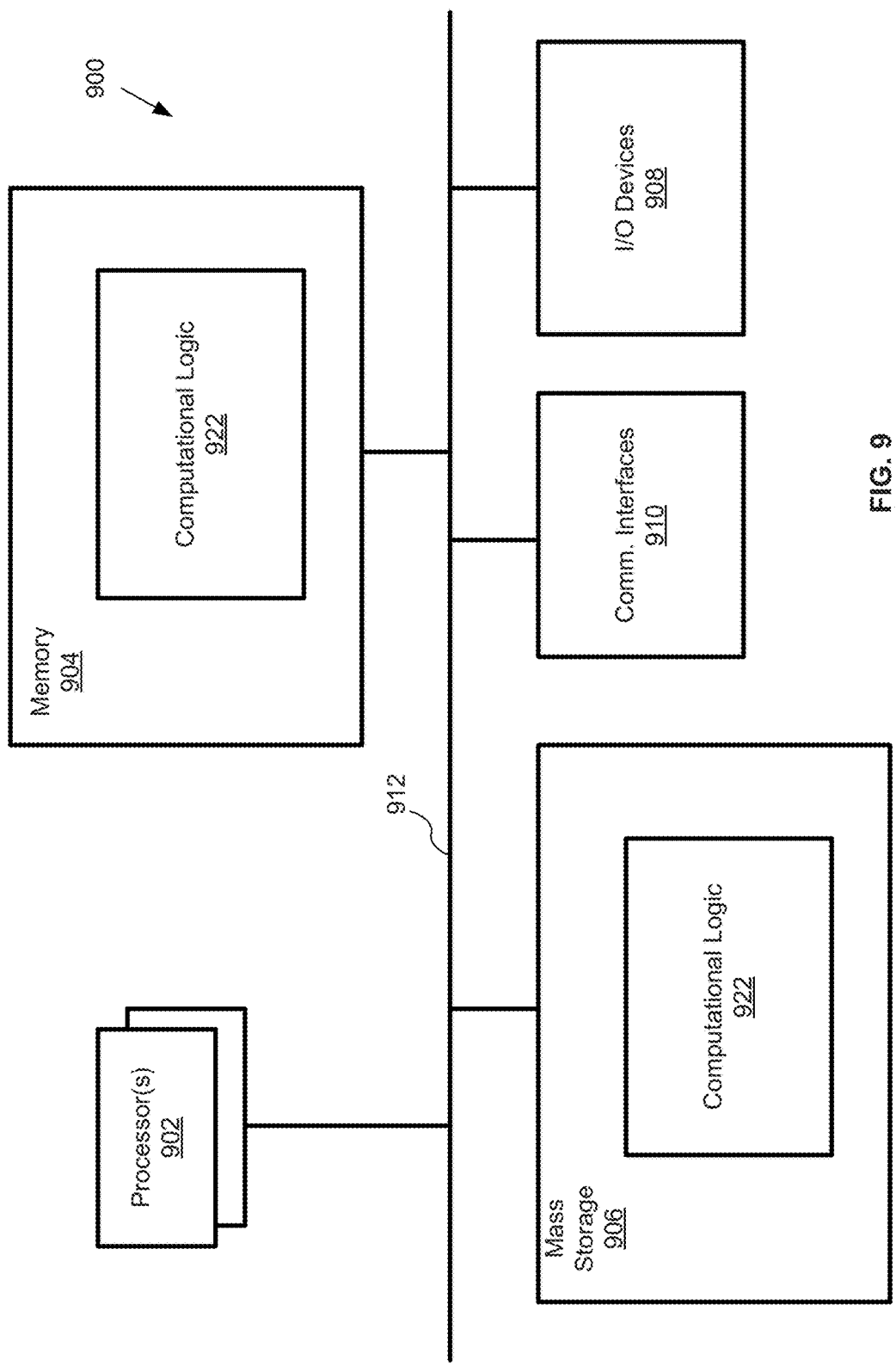
FIG. 9 illustrates an example computer device suitable for use to practice aspects of the present disclosure, according to some embodiments.

For instance, FIG. 9 illustrates an example computer device 900 suitable for use to practice aspects of the present disclosure, in accordance with various embodiments. In some embodiments, computer device 900 may include the assembly 100. As shown, computer device 900 may include one or more processors 902, and system memory 904. The processor 902 may include any type of processors. The processor 902 may be implemented as an integrated circuit having a single core or multi-cores, e.g., a multi-core microprocessor. The computer device 900 may include mass storage devices 906 (such as diskette, hard drive, volatile memory (e.g., DRAM), compact disc read only memory (CD-ROM), digital versatile disk (DVD), flash memory, solid state memory, and so forth). In general, system memory 904 and/or mass storage devices 906 may be temporal and/or persistent storage of any type, including, but not limited to, volatile and non-volatile memory, optical, magnetic, and/or solid state mass storage, and so forth. Volatile memory may include, but not be limited to, static and/or dynamic random access memory. Non-volatile memory may include, but not be limited to, electrically erasable programmable read only memory, phase change memory, resistive memory, and so forth.

The computer device 900 may further include input/output (I/O) devices 908 such as a microphone, sensors, display, keyboard, cursor control, remote control, gaming controller, image capture device, and so forth and communication interfaces 910 (such as network interface cards, modems, infrared receivers, optical receivers, radio receivers (e.g., WiFi)), antennas, and so forth.

The communication interfaces 910 may include communication chips (not shown) that may be configured to operate the device 900 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 910 may operate in accordance with other wireless protocols in other embodiments.

The above-described computer device 900 elements may be coupled to each other via a system bus 912, which may represent one or more buses. In the case of multiple buses, they may be bridged by one or more bus bridges (not shown). Each of these elements may perform its conventional functions known in the art. In particular, system memory 904 and mass storage devices 906 may be employed to store a working copy and a permanent copy of the programming instructions, generally shown as computational logic 922. Computational logic 922 may be implemented by assembler instructions supported by processor(s) 902 or high-level languages that may be compiled into such instructions. The permanent copy of the programming instructions may be placed into mass storage devices 906 in the factory, or in the field, through, for example, a distribution medium (not shown), such as a compact disc (CD), or through communication interfaces 910 (from a distribution server (not shown)).

The number, capability, and/or capacity of the elements 908, 910, 912 may vary, depending on whether computer device 900 is used as a stationary computing device, such as a set-top box or desktop computer, or a mobile computing device, such as a tablet computing device, laptop computer, game console, an Internet of Things (IoT), or smartphone. Their constitutions are otherwise known, and accordingly will not be further described.

In some embodiments, processor 902, I/O devices 908, and/or communication interfaces 910 may be implemented in part or whole as the assembly 100. For example, IC dies 106 and/or 108 may comprise the process 902, I/O devices 908, or communication interfaces 910.

In various implementations, the computer device 900 may comprise a laptop, a netbook, a notebook, an ultrabook, a smartphone, a tablet, a smartwatch, a wearable device, an Internet of Things (IoT) device, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computer device 900 may be any other electronic device that processes data.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

Illustrative examples of the devices, systems, and methods of various embodiments disclosed herein are provided below. An embodiment of the devices, systems, and methods may include any one or more, and any combination of, the examples described below.

Example 1 is an apparatus including one or more integrated circuits (ICs); a metallic structure that encircles the one or more ICs without being in contact with the one or more ICs, wherein the metallic structure is without an electrical ground; and a conductive epoxy layer disposed below and in contact with the metallic structure, wherein the conductive epoxy is to reduce an electromagnetic field induced by the metallic structure in response to a presence of a wireless signal that operates at approximately a resonant frequency associated with the metallic structure.

Example 2 may include the subject matter of Example 1, and may further include a substrate, wherein the conductive epoxy layer is disposed between the metallic structure and the substrate, and wherein the one or more ICs is electrically coupled and grounded to the substrate.

Example 3 may include the subject matter of any of Examples 1-2, and may further include wherein the substrate comprises a multi-layer structure, a coreless structure, or an ultra-thin core (UTC) structure.

Example 4 may include the subject matter of any of Examples 1-3, and may further include wherein the metallic structure comprises a stainless steel material and has a thickness of approximately 250 μm.

Example 5 may include the subject matter of any of Examples 1-4, and may further include wherein the metallic structure comprises a rectangular shape with a center cutout.

Example 6 may include the subject matter of any of Examples 1-5, and may further include wherein the conductive epoxy layer comprises an epoxy material interspersed with metallic particles.

Example 7 may include the subject matter of any of Examples 1-6, and may further include wherein the metallic particles comprise silver material.

Example 8 may include the subject matter of any of Examples 1-7, and may further include wherein the conductive epoxy layer has conductivity in a range of approximately 10 to $10^5$ Siemens/meter (S/m) or approximately 50,000 S/m.

Example 9 may include the subject matter of any of Examples 1-8, and may further include wherein the conductive epoxy layer has a thickness of approximately 40 to 50 μm.

Example 10 may include the subject matter of any of Examples 1-9, and may further include wherein the conductive epoxy layer is to reduce the electromagnetic field by more than 5 decibel (dB).

Example 11 may include the subject matter of any of Examples 1-10, and may further include wherein the resonant frequency comprises approximately 2.4 GHz.

Example 12 is a computer device including one or more radiative antennas that is to generate a signal; and one or more integrated circuit (IC) packages, wherein at least one of the one or more IC packages includes: one or more integrated circuits (ICs); a metallic structure that encircles the one or more ICs without being in contact with the one or more ICs, wherein the metallic structure is without an electrical ground; and a conductive epoxy layer disposed below and in contact with the metallic structure, wherein the conductive epoxy is to reduce an electromagnetic field induced by the metallic structure in response to the signal when the signal operates in a frequency band that is approximately at a resonant frequency associated with the metallic structure.

Example 13 may include the subject matter of Example 12, and may further include wherein the at least one of the one or more IC packages further includes substrate, wherein the conductive epoxy layer is disposed between the metallic structure and the substrate, and wherein the one or more ICs is electrically coupled and grounded to the substrate.

Example 14 may include the subject matter of any of Examples 12-13, and may further include wherein the substrate comprises a multi-layer structure, a coreless structure, or an ultra-thin core (UTC) structure.

Example 15 may include the subject matter of any of Examples 12-14, and may further include wherein the metallic structure comprises a stainless steel material and has a thickness of approximately 250 μm.

Example 16 may include the subject matter of any of Examples 12-15, and may further include wherein the metallic structure comprises a rectangular shape with a center cutout.

Example 17 may include the subject matter of any of Examples 12-16, and may further include wherein the conductive epoxy layer comprises an epoxy material interspersed with metallic particles.

Example 18 may include the subject matter of any of Examples 12-17, and may further include wherein the metallic particles comprise silver material.

Example 19 may include the subject matter of any of Examples 12-18, and may further include wherein the conductive epoxy layer has a conductivity in a range of approximately 10 to $10^5$ Siemens/meter (S/m) or approximately 50,000 S/m.

Example 20 may include the subject matter of any of Examples 12-19, and may further include wherein the conductive epoxy layer has a thickness of approximately 40 to 50 μm.

Example 21 may include the subject matter of any of Examples 12-20, and may further include wherein the conductive epoxy layer is to reduce the electromagnetic field by more than 5 decibel (dB).

Example 22 may include the subject matter of any of Examples 12-21, and may further include wherein the resonant frequency comprises approximately 2.4 GHz.

Example 23 may include the subject matter of any of Examples 12-22, and may further include wherein the one or more radiative antennas comprises one or more WiFi antennas.

Example 24 is an integrated circuit (IC) package including one or more IC dies; means for generating an electromagnetic field in response to a presence of signal excitation from one or more radiative antennas, the means for generating being free of an electrical ground and disposed adjacent to the one or more IC dies; and means for attenuating the electromagnetic field, wherein the means for attenuating has a conductivity in a range of approximately 10 to $10^5$ Siemens/meter (S/m), is disposed below the means for inducing, and is in contact with the means for inducing.

Example 25 may include the subject matter of Example 24, and may further include wherein the means for attenuating the electromagnetic field attenuates the electromagnetic field by more than 5 decibel (dB).

Example 26 may include the subject matter of any of Examples 24-25, and may further include wherein the means for attenuating the electromagnetic field attenuates the electromagnetic field by at least 10 decibel (dB).

Example 27 may include the subject matter of any of Examples 24-26, and may further include wherein the means for attenuating comprises an epoxy material interspersed with metallic particles.

Example 28 may include the subject matter of any of Examples 24-27, and may further include wherein the means for attenuating has a conductivity of approximately 50,000 Siemens/meter (S/m).

Example 29 may include the subject matter of any of Examples 24-28, and may further include wherein the signal excitation operates at a frequency band that includes a resonant frequency associated with the means for generating.

Example 30 may include the subject matter of any of Examples 24-29, and may further include wherein the means for generating comprises a metallic package stiffener.

Example 31 is a method including generating, by a package stiffener included in an integrated circuit (IC) package, an electromagnetic field, wherein the package stiffener is proximate to signal excitation from one or more radiative antennas and the package stiffener is without an electrical ground; and attenuating, by a conductive epoxy layer provided below the package stiffener and included in the IC package, the electromagnetic field.

Example 32 may include the subject matter of Example 31, and may further include wherein attenuating the electromagnetic field comprises attenuating the electromagnetic field by more than 5 decibel (dB).

Example 33 may include the subject matter of any of Examples 31-32, and may further include wherein attenuating the electromagnetic field comprises attenuating the electromagnetic field by at least 10 decibel (dB).

Example 34 may include the subject matter of any of Examples 31-33, and may further include wherein the conductive epoxy layer comprises an epoxy material interspersed with metallic particles.

Example 35 may include the subject matter of any of Examples 31-34, and may further include wherein the conductive epoxy layer has a conductivity in the range of approximately 10 to $10^5$ Siemens/meter (S/m).

Example 36 may include the subject matter of any of Examples 31-35, and may further include wherein the conductive epoxy layer has a conductivity of approximately 50,000 Siemens/meter (S/m).

Example 37 may include the subject matter of any of Examples 31-36, and may further include wherein the signal excitation operates at a frequency band that includes a resonant frequency associated with the package stiffener.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

We claim:
1. An apparatus comprising:
one or more integrated circuits (ICs);
a metallic structure that encircles the one or more ICs without being in contact with the one or more ICs, wherein the metallic structure is without an electrical ground; and
a conductive epoxy layer disposed below and in contact with the metallic structure,
wherein the conductive epoxy layer is to reduce an electromagnetic field induced by the metallic structure in response to a presence of a wireless signal that operates at approximately a resonant frequency associated with the metallic structure, wherein the resonant frequency comprises approximately 2.4 GHz.

2. The apparatus of claim 1, further comprising a substrate, wherein the conductive epoxy layer is disposed between the metallic structure and the substrate, and wherein the one or more ICs is electrically coupled and grounded to the substrate.

3. The apparatus of claim 2, wherein the substrate comprises a multi-layer structure, a coreless structure, or an ultra-thin core (UTC) structure.

4. The apparatus of claim 1, wherein the metallic structure comprises a stainless steel material and has a thickness of approximately 250 μm.

5. The apparatus of claim 1, wherein the conductive epoxy layer comprises an epoxy material interspersed with metallic particles.

6. The apparatus of claim 5, wherein the metallic particles comprise silver material.

7. The apparatus of claim 1, wherein the conductive epoxy layer has a conductivity in a range of approximately 10 to $10^5$ Siemens/meter (S/m) or approximately 50,000 S/m.

8. The apparatus of claim 1, wherein the conductive epoxy layer is to reduce the electromagnetic field by more than 5 decibels (dB).

9. A computer device comprising:
one or more radiative antennas that are to generate a signal; and
one or more integrated circuit (IC) packages, wherein at least one of the one or more IC packages includes:
one or more integrated circuits (ICs);
a metallic structure that encircles the one or more ICs without being in contact with the one or more ICs, wherein the metallic structure is without an electrical ground; and
a conductive epoxy layer disposed below and in contact with the metallic structure, wherein the conductive epoxy layer is to reduce an electromagnetic field induced by the metallic structure in response to the signal when the signal operates in a frequency band that is approximately at a resonant frequency associated with the metallic structure, wherein the resonant frequency comprises approximately 2.4 GHz.

10. The computer device of claim 9, wherein the metallic structure comprises a rectangular shape with a center cutout.

11. The computer device of claim 9, wherein the conductive epoxy layer comprises an epoxy material interspersed with metallic particles.

12. The computer device of claim 9, wherein the conductive epoxy layer has a conductivity in a range of approximately 10 to 10^5 Siemens/meter (S/m) or approximately 50,000 S/m.

13. The computer device of claim 9, wherein the conductive epoxy layer has a thickness of approximately 40 to 50 μm.

14. The computer device of claim 9, wherein the one or more radiative antennas comprises one or more WiFi antennas.

15. An integrated circuit (IC) package comprising:
one or more IC dies;
means for generating an electromagnetic field in response to a presence of signal excitation from one or more radiative antennas, the means for generating being free of an electrical ground and disposed adjacent to the one or more IC dies; and
means for attenuating the electromagnetic field, wherein the means for attenuating has a conductivity in a range of approximately 10 to 105 Siemens/meter (S/m), is disposed below a means for inducing, and is in contact with the means for inducing, wherein the signal excitation operates at a frequency band that includes a resonant frequency associated with the means for generating, the wherein resonant frequency comprises approximately 2.4 GHz.

16. The IC package of claim 15, wherein the means for attenuating the electromagnetic field attenuates the electromagnetic field by at least 10 decibels (dB).

17. The IC package of claim 15, wherein the means for attenuating has a conductivity of approximately 50,000 Siemens/meter (S/m).

18. The IC package of claim 15, wherein the means for generating comprises a metallic package stiffener.

* * * * *